US007136290B1

(12) United States Patent
Wise

(10) Patent No.: US 7,136,290 B1
(45) Date of Patent: Nov. 14, 2006

(54) BLADE CIRCUIT CROSS-CONNECTION ADAPTED FOR PEER-TO-PEER BACKPLANES

(75) Inventor: Jeffrey L. Wise, Acton, MA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/443,784

(22) Filed: May 31, 2006

(51) Int. Cl.
*H01R 12/16* (2006.01)
(52) U.S. Cl. .................. 361/788; 361/796; 361/798
(58) Field of Classification Search ............. 361/788, 361/796–800; 710/300–305
See application file for complete search history.

(56) References Cited

U.S. PATENT DOCUMENTS

| | | | |
|---|---|---|---|
| 5,536,981 A * | 7/1996 | Sato et al. ................. | 307/116 |
| 6,404,650 B1 * | 6/2002 | Boniface et al. ............ | 361/796 |
| 6,425,762 B1 * | 7/2002 | Ernst ........................... | 434/29 |
| 6,662,254 B1 * | 12/2003 | Tal et al. ..................... | 710/300 |

* cited by examiner

*Primary Examiner*—Tuan Dinh
(74) *Attorney, Agent, or Firm*—Kevin D. Wills

(57) ABSTRACT

A blade (202a) with first circuit entity (210) having a transmit output (280) coupled to a first connector (260) and a receive input (282) coupled to a third connector (264), and a second circuit entity (212) having a transmit output (284) coupled to the fourth connector (266) and a receive input (286) coupled to a second connector (262). The first, second, third and fourth connectors of the blade (202a) are adapted to connect to a peer-to-peer backplane (104) that electrically connects the blade (202a) to a remote blade (202b) through remote connectors (150, 152, 154, 156) on the backplane (104). The backplane (104) cross-connects the first connector (140) to a remote second connector (152) cross-connects the second connector (142) to the remote first connector (150). The backplane cross-connects the fourth connector (146) to a remote third connector (154) and cross-connects the third connector (144) to a remote fourth connector (156).

9 Claims, 2 Drawing Sheets

BLADE CIRCUIT CROSS-CONNECTION ADAPTED FOR PEER-TO-PEER BACKPLANES

FIELD OF THE INVENTION

The present invention generally relates to circuit cards adapted to be inserted into a backplane and more particularly relates to interface connections for circuit cards adapted to fit into standards-defined chasses.

BACKGROUND OF THE INVENTION

Standardized electronic circuit chasses, such as chasses that conform to the Advanced Telecommunication Computing Architecture (ATCA), define backplane connections that allow multiple circuit cards, or blades, to be physically inserted at different locations on the backplane. The backplane then provides a defined electrical connection between circuits on one blade and circuits on another blade that is inserted at a different connection on the backplane. In the case of the ATCA, connections between two identical blades connected to the Update Channel of the backplane are designed to allow corresponding circuit entities on the identical blades to communicate to each other.

The ATCA standard does not, however, address allowing different circuit entities on identical blades to communicate with each other. Allowing different circuit entities of identical blades to communicate with each other is required, for example, with system architectures designed to provide redundancy by using identical blades that are able to interoperate with each other in response to a failure on one blade. Such operation is not defined by the ATCA standard and is often accomplished by custom wiring of the otherwise "identical" blades to achieve this communications between non-corresponding entities on different blades.

Therefore a need exists to overcome the problems with the prior art as discussed above.

SUMMARY OF THE INVENTION

In accordance with an embodiment of the present invention, an electronic component adapted to connect to a backplane includes a first connector pair that has a first connector and a second connector that are each adapted to couple with a first connector pair of a backplane for peer-to-peer communications to a remote first connector pair of the backplane. The first connector pair of the backplane comprising a first backplane connector and a second backplane connector. The remote first connector pair includes a remote first connector and a remote second connector. The backplane being adapted to cross-connect the first backplane connector to the remote second connector and to cross-connect the second backplane connector to the remote first connector. The electronic component further includes a second connector pair that includes a third connector and a fourth connector each being adapted to connect to a second connector pair of the backplane for peer-to-peer communications to a remote second connector pair of the backplane. The second connector pair of the backplane including a third backplane connector and a fourth backplane connector. The remote second connector pair includes a remote third connector and a remote fourth connector. The backplane is adapted to cross-connect the third backplane connector to the remote forth connector and to cross-connect the fourth backplane connector to the remote third connector. The electronic component also includes a first circuit entity that includes a first transmit output communicatively coupled to the first connector and further includes a first receive input communicatively coupled to the third connector. The electronic component further includes a second circuit entity that has a second transmit output communicatively coupled to the fourth connector and further includes a second receive input communicatively coupled to the second connector.

In accordance with another aspect of the present invention, a method of providing electronic entity connectivity to a backplane includes providing a first connector pair on an electronic circuit. The first connector pair is mechanically coupled to the electronic circuit and includes a first connector and a second connector each adapted to couple with a first connector pair of a backplane for peer-to-peer communications to a remote first connector pair of the backplane. The first connector pair of the backplane comprising a first backplane connector and a second backplane connector. The remote first connector pair includes a remote first connector and a remote second connector. The backplane is adapted to cross-connect the first connector to the remote second connector and to cross-connect the second connector to the remote first connector. The method further includes providing a second connector pair on the electronic circuit. The second connector pair is mechanically coupled to the electronic circuit. The second connector pair includes a third connector and a fourth connector that is each adapted to connect to a second connector pair of the backplane for peer-to-peer communications to a remote second connector of the backplane. The second connector pair of the backplane comprising a third backplane connector and a fourth backplane connector. The remote second connector pair includes a remote third connector and a remote fourth connector. The backplane is adapted to cross-connect the third connector to the remote forth connector and to cross-connect the fourth connector to the remote third connector. The method further includes providing a first circuit entity in the electronic circuit. The first circuit entity includes a first transmit output that is communicatively coupled to the first connector and further includes a first receive input that is communicatively coupled to the third connector. The method also includes providing a second entity in the electronic circuit. The second entity includes a second transmit output that is communicatively coupled to the fourth connector and further includes a second receive input that is communicatively coupled to the second connector.

In accordance with another aspect of the present invention, a telecommunications switching center processing system includes a backplane and at least one processing blade. The at least one processing blade is adapted to couple to the backplane and includes a first connector pair that has a first connector and a second connector that are each adapted to couple with a first connector of a backplane for peer-to-peer communications to a remote first connector of the backplane. The first connector pair of the backplane comprising a first backplane connector and a second backplane connector. The remote first connector includes a remote first connector and a remote second connector. The backplane being adapted to cross-connect the first connector to the remote second connector and to cross-connect the second connector to the remote first connector. The at least one processing blade further includes a second connector pair that includes a third connector and a fourth connector each being adapted to connect to a second connector pair of the backplane for peer-to-peer communications to a remote second connector of the backplane. The remote second connector includes a remote third connector and a remote fourth connector. The backplane is adapted to cross-connect the third connector to the remote forth connector and to cross-connect the fourth connector to the remote third connector. The at least one processing blade also includes a first circuit entity that includes a first transmit output communicatively coupled to the first connector and further includes a first receive input communicatively coupled to the third connector. The at least one processing blade further includes a second circuit entity that has a second transmit output communicatively coupled to the fourth connector and further includes a second receive input communicatively coupled to the second connector.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language).

Figure 1:
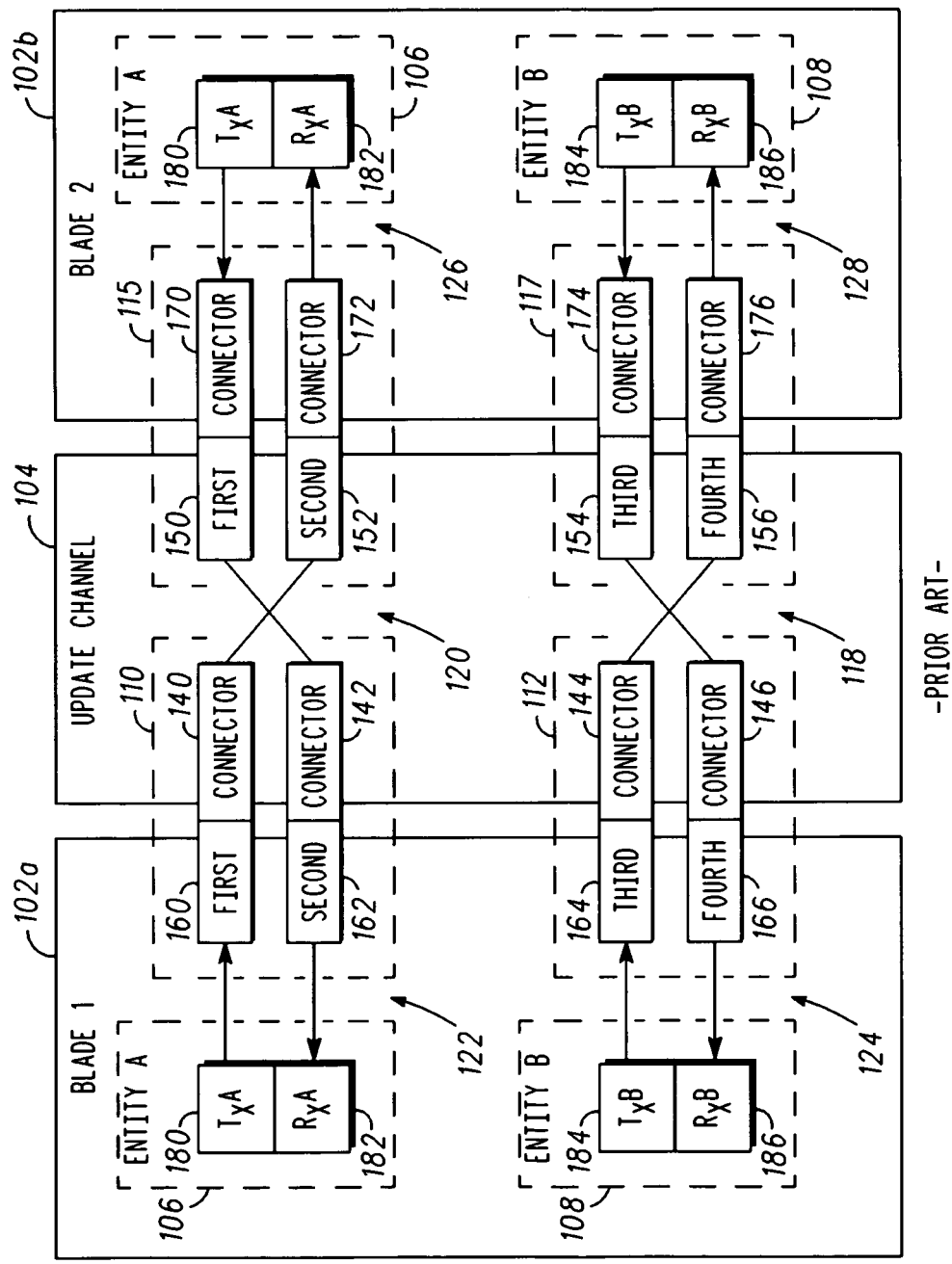
FIG. 1 is a conventional multiple blade and backplane interconnection diagram according to the ATCA Update Channel specification.

FIG. 1 is a conventional multiple blade and backplane interconnection diagram 100 according to the ATCA Update Channel specification. The Advanced Telecommunications Computing Architecture (ATCA) as referred to in the context of this description is defined by the PICMG 3.0® Advanced Telecommunications Computing Architecture specification as approved and distributed by the PCI Industrial Computer Manufacturers Group (PICMG) of Wakefield, Mass., USA. The following discussion refers to this version of the Advanced Telecommunications Computing Architecture specification as the "ATCA specification." The entire contents and teachings of the PICMG 3.0® Advanced Telecommunications Computing Architecture specification are hereby incorporated herein by reference.

The conventional multiple blade and backplane interconnection diagram 100 illustrates two identical blades, a blade 1 102a and a blade 2 102b. The characteristics of Blade 1 102a will be discussed below with the understanding that the characteristics of identical blade 2 102b are similar to those described for blade 1 102a.

Blade 1 102a includes two circuit entities, a circuit entity A 106 and a circuit entity B 108. Circuit entity A 106 has a transmit output A (TxA) 180 and a receive input A (RxA) 182. Circuit entity B 108 similarly has a transmit output B (TxB) 184 and a receive input B (RxB) 186.

Blade 1 102a electrically and mechanically connects to an update channel 104 that is part of an ATCA backplane in one embodiment. The conventional multiple blade and backplane interconnection diagram 100 illustrates two electrical connector pair sets that connect the two circuit entities of blade 1 102a to two communications channel pairs of the update channel 104. A first connector pair set includes a blade first connector pair 111 and an update channel first connector pair 110. The blade first connector pair 111 includes a blade first connector 160 and a blade second connector 162. The update channel first connector pair 110 includes a backplane first connector 140 and a backplane second connector 142. The blade first connector 160 connects to the backplane first connector 140 and the blade second connector 162 connects to the backplane second connector 142 to form a first connector pair set that electrically couples entity A 106 to the update channel first circuit 120.

A second connector pair set similarly includes a blade second connector pair 113 and an update channel second connector pair 112. The blade second connector pair 113 includes a blade third connector 164 and a blade fourth connector 166. The update channel second connector pair 112 includes a backplane third connector 144 and a backplane fourth connector 146. The blade second connector pair operates to connect entity B 108 to the update channel second circuit 118. The multiple blade and backplane interconnection diagram 100 illustrates that the blade first connector 160, the blade second connector 162, the blade third connector 164 and the blade fourth connector 166 each respectively connect to the backplane first connector 140, the backplane second connector 142, the backplane third connector 144 and the backplane fourth connector 146. This arrangement allows the blade to be separated from the backplane, which contains the update channel 104, by separating these electrical connections.

The backplane first connector 140, the backplane second connector 142, the backplane third connector 144 and the backplane fourth connector 146 are each in electrical communications with a remote connector at a different blade connection of the update channel 104 through either the update channel first circuit 120 or the update channel second circuit 118. The update channel 104, as defined by the ATCA, supports peer-to-peer connections of two blades that are connected to the update channel. The peer-to-peer connections for these two blades are provided in the update channel by connecting the backplane first connector 140, which connects to a first blade, i.e., blade 1 102a, to a backplane remote second connector 152. The backplane second connector 142 is connected to the backplane remote first connector 150.

The cross connection provided by the update channel first circuit 120 places the transmit output A (TxA) 180 of blade 1 102a in electrical communications with receive input A (RxA) 182 of blade 2 102b. The update channel first circuit 120 also provides electrical communications between receive input A (RxA) 182 of blade 1 102a and transmit output A (TxA) 180 of blade 2 102b.

The backplane third connector 144 is connected to the backplane remote fourth connector 156 and the backplane fourth connector 146 is connected to the backplane remote third connector 154. These connections, provided by the update channel second circuit 118, provide cross connections of the two channels of entity B 108 to provide electrical communications between the transmit output B (TxB) 148 of blade 1 102a and the receive input B (RxB) 186 of blade 2 102b as well as electrical communications between the receive input B (RxB) 186 of blade 1 102a and transmit output B (TxB) 184 of blade 2 102b. As is shown in the multiple blade and backplane interconnection diagram 100, the transmit and receive ports of element A 106 on blade 102a are connected to the receive and transmit ports, respectively, of element A 106 on blade 2 102b. Element B 108 of blade 1 102a is similarly connected to element B 108 of blade 2 102b by this arrangement.

Figure 2:
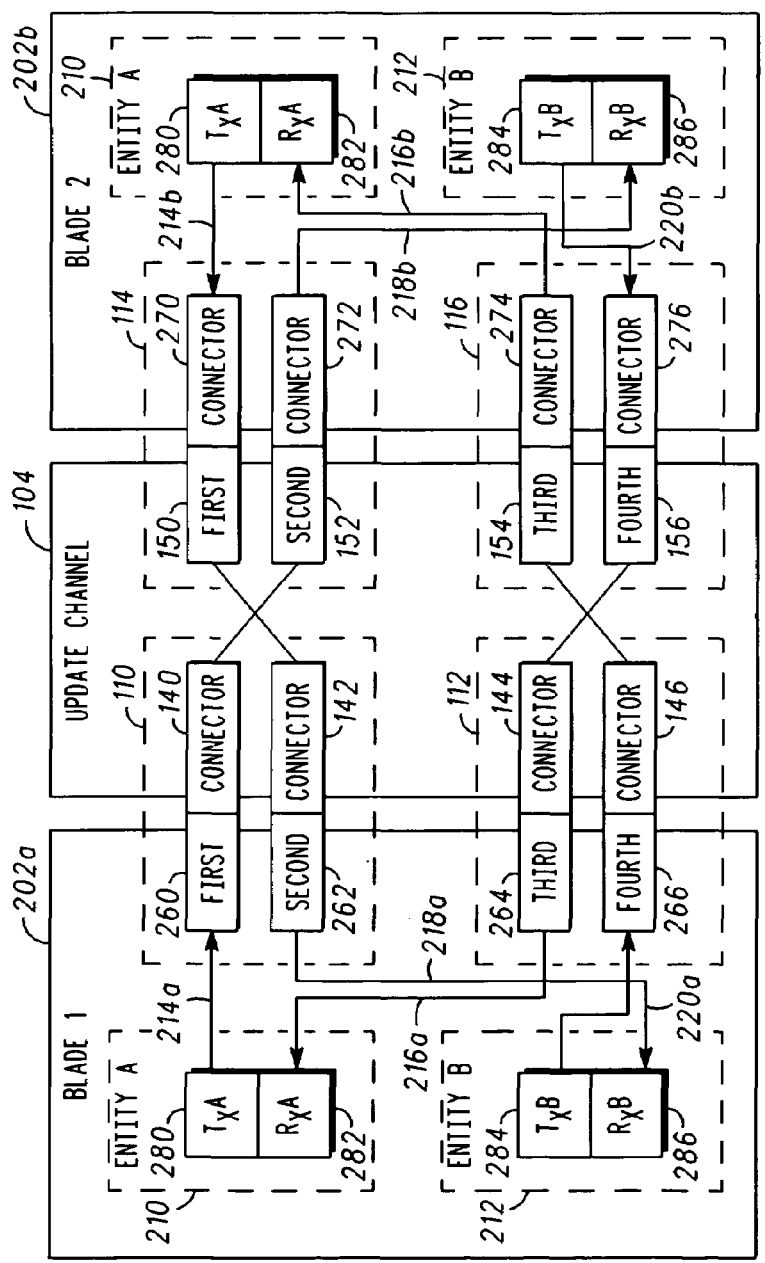
FIG. 2 illustrates a multiple blade and backplane interconnection diagram in accordance with an embodiment of the present invention.

FIG. 2 illustrates a multiple blade and backplane interconnection diagram 200 in accordance with one embodiment of the present invention. The multiple blade and backplane interconnection diagram 200 provides modified blades, such as modified blade 1 202a and modified blade 2 202b, that operate with a conventional update channel 104. These modified blades have different electrical connections between the two electronic circuit entities, i.e., entity A 210, entity B 212, and the connectors that connect the blades to the update channel 104. These modified blades do not otherwise differ from the blade 1 102a and blade 2 102b described above for the conventional multiple blade and backplane interconnection diagram 100. The modified blades have a modified design relative to the blades of the conventional multiple blade and backplane interconnection diagram 100 but are able to be fabricated according to this design and are not actually modifications of a pre-existing blade.

The modified blades of this one embodiment are able to include circuit entities, such as entity A 210 and entity B 212 that are identical to the entity A 106 and entity B 108 illustrated for the conventional multiple blade and backplane interconnection diagram 100. The unique characteristics of modified blade 1 202a are described below with the understanding that the modified blade 1 202a is identical to the modified blade 2 202b and that the following description applies to the modified blade 2 202b as well. The circuits illustrated by the multiple blade and backplane interconnection diagram 200 are able to implement, for example, a telecommunications switching center processing system.

As illustrated by the multiple blade and backplane interconnection diagram 200, the modified blade 1 202a includes an electrical connection from transmit output A (TxA) 280 of entity A 210 through an electrical connection 214a to the blade first connector 260. The modified blade 1 202a also includes an electrical connection from receive input A (RxA) 282 of entity A 210 through an electrical connection 216a to the blade third connector 264. The modified blade 1 202a further includes an electrical connection from transmit output B (TxB) 284 of entity B 212 through an electrical connection 220a to the blade fourth connector 266. The modified blade 1 202a also includes an electrical connection from receive input B (RxB) 286 of entity B 212 through an electrical connection 218a to the blade second connector 262.

The above described connections for the modified blade 1 202a and modified blade 2 202b are electrically identical for each of these two modified blades of this embodiment of the present invention. These two modified blades have identical connections to electrically connect entity A 210 and entity B 212 to the electrical connectors on the modified blade used to electrically connect the modified blade to the conventional update channel 104 of this embodiment. When two modified blades are installed on the conventional update channel 104, these modified electrical connections provide an electrical communications path between transmit output A 280 of blade 1 202a and receive input B 286 of blade 2 202b. An electrical connection is further provided between receive input A 282 of blade 1 202a and transmit output B 284 of blade 2 202b.

The electrical connections of the two modified blades of this embodiment of the present invention that are connected to an update channel effectively connect entity A 210 of blade 1 202a to entity B 212 of blade 2 202b. As is clear from the multiple blade and backplane interconnection diagram 200 and the above description, entity B 212 of blade 1 202a is also electrically connected to entity A 210 of blade 2 202b. This is in contrast to the conventional connectivity provided by the conventional multiple blade and backplane interconnection diagram 100, where entity A 106 of blade 1 101a is connected to entity A 106 of blade 2 101b and entity B 108 of blade 1 101a is connected to entity B 108 of blade 2 101b.

The above described embodiment provides this connectivity without the use of jumpers or custom wiring on each modified blade. In contrast, embodiments of the present invention provide these advantages with uniform modified blade wiring on each modified blade, thereby minimizing spare parts inventories of modified blades and simplifying logistics support.

Figure 3:
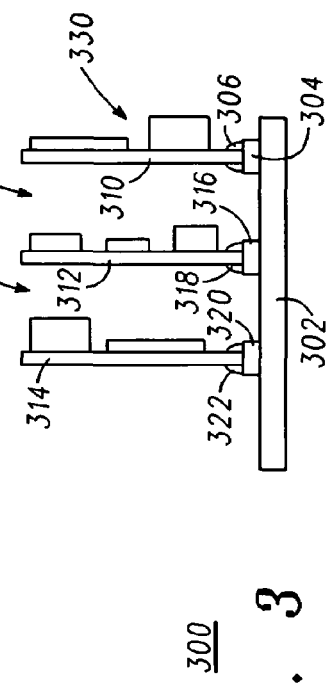
FIG. 3 illustrates a backplane and blade installation diagram in accordance with an embodiment of the present invention.

FIG. 3 illustrates a backplane and blade installation diagram 300 in accordance with one embodiment of the present invention. The backplane and blade installation diagram 300 illustrates a backplane 302 that has three blades, blade A 310, blade B 312 and blade C 314, connected thereto. The backplane 302 of this one embodiment contains several electrical connection paths, including the above described connectivity of update channel 104, between blade connections.

The three blades each have components 330 that are part of electronic circuits that are part of each blade. These components include the electronic circuit components used to form, for example, entity A 210 and entity B 212 of the modified blade 202a.

The backplane and blade installation diagram 300 illustrates electrical connectors that are used to provide electrical connectivity between the blades and the backplane 302. The above embodiments of the present invention include other connectors, such as mechanical connectors, that are part of the entire structure but are not shown in the backplane and blade installation diagram 300 in order to more clearly describe the relevant components of the present invention. The electrical connectors that provide electrical communications between the blades and the backplane 302 of this embodiment of the present invention are defined by the ATCA specification.

Backplane 302 is shown to have three backplane connectors, backplane connector A 304, backplane connector B 316 and backplane connector C 320. Each of these backplane connectors has an associated blade attached thereto by a blade connector that is attached, mechanically and electrically, to the blade. Blade A 310 has a blade A electrical connector 306, blade B 312 has a blade B electrical connector 318 and blade C 314 has a blade C electrical connector 322. The blade A electrical connector 306, the blade B electrical connector 318 and the blade C electrical connector 322 are identical electrical connectors in one embodiment and are adapted to electrically and mechanically connect to the backplane connectors as is specified by the ATCA specification.

Reference throughout the specification to "one embodiment" means that a particular feature, structure, or characteristic described in connection with the embodiment is included in at least one embodiment of the present invention. Thus, the appearances of the phrases "in one embodiment" in various places throughout the specification are not necessarily all referring to the same embodiment. Furthermore, the particular features, structures, or characteristics may be combined in any suitable manner in one or more embodiments. Moreover these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

While the various embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An electronic component adapted to connect to a backplane, the electronic component comprising:
   a first connector pair comprising a first connector and a second connector each adapted to couple with a first connector pair of a backplane for peer-to-peer communications to a remote first connector pair of the backplane, the first connector pair of the backplane comprising a first backplane connector and a second backplane connector, the remote first connector pair comprising a remote first connector and a remote second connector, the backplane being adapted to cross-connect the first backplane connector to the remote second connector and to cross-connect the second backplane connector to the remote first connector;
   a second connector pair comprising a third connector and a fourth connector each being adapted to connect to a second connector pair of the backplane for peer-to-peer communications to a remote second connector pair of the backplane, the second connector pair of the backplane comprising a third backplane connector and a fourth backplane connector, the remote second connector pair comprising a remote third connector and a remote fourth connector, the backplane being adapted to cross-connect the third backplane connector to the remote forth connector and to cross-connect the fourth backplane connector to the remote third connector;
   a first circuit entity comprising a first transmit output communicatively coupled to the first connector and further comprising a first receive input communicatively coupled to the third connector; and
   a second circuit entity comprising a second transmit output communicatively coupled to the fourth connector and further comprising a second receive input communicatively coupled to the second connector.

2. The electronic component according to claim 1, wherein the electronic circuit is adapted to conform to requirements for a front board of an advanced telecommunications computing architecture system.

3. The electronic component according to claim 2, wherein the first transmit connector, the first receive connector, the second transmit connector, and the second receive connector connect to update channels of the advanced telecommunications computing architecture system.

4. A method of providing electronic entity connectivity to a backplane, the method comprising:
   providing a first connector pair on an electronic circuit, the first connector pair being mechanically coupled to the electronic circuit, the first connector pair comprising a first connector and a second connector each adapted to couple with a first connector of a backplane for peer-to-peer communications to a remote first connector of the backplane, the first connector pair of the backplane comprising a first backplane connector and a second backplane connector, the remote first connector comprising a remote first connector and a remote second connector, the backplane being adapted to cross-connect the first backplane connector to the remote second connector and to cross-connect the second backplane connector to the remote first connector;
   providing a second connector pair in the electronic circuit, the second connector pair being mechanically coupled to the electronic circuit, the second connector pair comprising a third connector and a fourth connector each being adapted to connect to a second connector pair of the backplane for peer-to-peer communications to a remote second connector of the backplane, the second connector pair of the backplane comprising a third backplane connector and a fourth backplane connector, the remote second connector comprising a remote third connector and a remote fourth connector, the backplane being adapted to cross-connect the third backplane connector to the remote forth connector and to cross-connect the fourth backplane connector to the remote third connector;
   providing a first circuit entity in the electronic circuit, the first circuit entity comprising a first transmit output communicatively coupled to the first connector and further comprising a first receive input communicatively coupled to the third connector; and
   providing a second entity in the electronic circuit, the second entity comprising a second transmit output communicatively coupled to the fourth connector and further comprising a second receive input communicatively coupled to the second connector.

5. The method of claim 4, further comprising adapting the electronic circuit to conform to requirements for a front board of an advanced telecommunications computing architecture system.

6. The method of claim 5, further comprising adapting the first transmit connector, the first receive connector, the second transmit connector, and the second receive connector to connect to update channels of the advanced telecommunications computing architecture system.

7. A telecommunications switching center processing system, comprising:
   a backplane; and
   at least one processing blade adapted to couple to the backplane, the at least one processing blade comprising:
      a first connector pair comprising a first connector and a second connector each adapted to couple with a first connector of a backplane for peer-to-peer communications to a remote first connector of the backplane, the first connector pair of the backplane comprising a first backplane connector and a second backplane connector, the remote first connector comprising a remote first connector and a remote second connector, the backplane being adapted to cross-connect the first connector to the remote second connector and to cross-connect the second connector to the remote first connector;

a second connector pair comprising a third connector and a fourth connector each being adapted to connect to a second connector of the backplane for peer-to-peer communications to a remote second connector pair of the backplane, the second connector pair of the backplane comprising a third backplane connector and a fourth backplane connector, the remote second connector comprising a remote third connector and a remote fourth connector, the backplane being adapted to cross-connect the third connector to the remote forth connector and to cross-connect the fourth connector to the remote third connector;

a first circuit entity comprising a first transmit output communicatively coupled to the first connector and further comprising a first receive input communicatively coupled to the third connector; and a second circuit entity comprising a second transmit output communicatively coupled to the fourth connector and further comprising a second receive input communicatively coupled to the second connector.

8. The telecommunications switching center processing system according to claim 7, wherein the telecommunications switching center processing system is adapted to conform to requirements for an advanced telecommunications computing architecture system.

9. The telecommunications switching center processing system according to claim 8, wherein the first transmit connector, the first receive connector, the second transmit connector, and the second receive connector connect to update channels of the advanced telecommunications computing architecture system.

* * * * *